United States Patent
Bangalore et al.

(10) Patent No.: US 9,994,753 B2
(45) Date of Patent: Jun. 12, 2018

(54) PROCESS TO EXTRACT LIQUID DIELECTRIC COOLANT FROM THE RICE BRAN OIL

(71) Applicant: Dr. Ambedkar Institute of Technology, Bangalore (IN)

(72) Inventors: Sumangala Viswanath Bangalore, Bangalore (IN); Nagabhushana Ramaswamy Galigekere, Bangalore (IN); Vasudevamurthy Siddappa, Bangalore (IN); Champa Vedvyas, Bangalore (IN); Nagashree Narasimha Iyengar Ambuga, Bangalore (IN)

(73) Assignee: Dr. Ambedkar Institute of Technology, Bangalore (IN)

( * ) Notice: Subject to any disclaimer, the term of this patent is extended or adjusted under 35 U.S.C. 154(b) by 0 days. days.

(21) Appl. No.: 15/236,082

(22) Filed: Aug. 12, 2016

(65) Prior Publication Data

US 2017/0130113 A1    May 11, 2017

(30) Foreign Application Priority Data

Aug. 14, 2015   (IN) .......................... 4251/CHE/2015

(51) Int. Cl.
   *C09K 5/10*    (2006.01)
   *H05K 7/20*    (2006.01)
   *B01D 11/04*   (2006.01)
   *H01B 3/20*    (2006.01)

(52) U.S. Cl.
   CPC ............ *C09K 5/10* (2013.01); *B01D 11/0492* (2013.01); *H01B 3/20* (2013.01); *H05K 7/20218* (2013.01)

(58) Field of Classification Search
   CPC ....................................................... C09K 5/10
   See application file for complete search history.

(56) References Cited

U.S. PATENT DOCUMENTS

| | | | | | |
|---|---|---|---|---|---|
| 5,773,075 | A | * | 6/1998 | Todd ....................... | A23L 27/11 426/425 |
| 5,985,352 | A | * | 11/1999 | Todd ....................... | A23L 27/11 426/481 |
| 6,033,706 | A | * | 3/2000 | Silkeberg ................ | A23D 7/001 426/417 |
| 2002/0110670 | A1 | * | 8/2002 | Keeton .............. | B41M 5/38214 428/32.82 |
| 2013/0099182 | A1 | * | 4/2013 | Rebouillat ............... | H01B 3/20 252/579 |

* cited by examiner

*Primary Examiner* — Nicole M Buie-Hatcher
*Assistant Examiner* — M. Reza Asdjodi
(74) *Attorney, Agent, or Firm* — Blueshift IP, LLC; Robert Plotkin

(57) ABSTRACT

The present invention provides a process to extract liquid dielectric coolant from the rice bran oil, which is suitable for both power frequency and high frequency electrical applications. The process comprises the steps of, processing the refined, bleached and deodorized rice bran oil with an alkali to remove the fatty acids. After processing the rice bran seed oil, at step, the processed rice bran oil is blended with a sodium hydroxide (NaOH) solution. The blended rice bran oil forms a top layer and a bottom layer within short duration of time. At step, the top layer is extracted and is water washed and filtered. At step, the top layer rice bran oil is mixed with the tert butyl hydroxy quinone solution. Finally, at step, the mixture of filtered top layer and tert butyl hydroxy quinone solution is heated to extract the liquid dielectric coolant.

9 Claims, 5 Drawing Sheets

| Temperature | Biotemp |
|---|---|
| Room temperature | 0.0015 |
| At higher Temperatures | 0.02(100°C) |

FIGURE 2

| Temperature | Envirotemp |
|---|---|
| Room temperature | 0.0001-0.0015 |
| At higher Temperatures | 0.02 (90°C) |

FIGURE 3

| Frequency | Silicone Fluid at Room Temperature | Silicone Fluid at 90°C |
|---|---|---|
| 5kHz | 0.00009 | 0.00003 |
| 100kHz | 0.0004 | 0.001 |
| 250kHz | 0.0009 | 0.002 |
| 500kHz | 0.0018 | 0.03 |

FIGURE 4

|  | Power Frequency | High Frequency |
| --- | --- | --- |
|  | Mineral Oil | Silicone fluid |
| Relative Permittivity | 2.1 | 2.7 |

FIGURE 5

| Kinematic viscosity at 100°C cSt. | |
| --- | --- |
| Biotemp | 10 |
| EnviroTemp | 7.7-8.3 |

FIGURE 6

| Temperature | Rice bran oil |
|---|---|
| Room temperature | 0.0016 |
| At higher Temperatures | 0.11(90°C) |

FIGURE 7

| Frequency | Rice bran oil at Room Temperature | Rice bran oil at 90°C |
|---|---|---|
| 5kHz | 0.0003 | 0.00149 |
| 100kHz | 0.0005 | 0.00005 |
| 250kHz | 0.0011 | 0.00011 |
| 500kHz | 0.0021 | 0.00024 |

FIGURE 8

|  | Power Frequency | High Frequency |
|---|---|---|
|  | Rice bran oil | Rice bran oil |
| Relative Permittivity | 2.7-3.1 | 2.7-3.1 |

FIGURE 9

| Kinematic viscosity at 100°C cSt. ||
|---|---|
| Rice bran oil | 9.3 |

FIGURE 10

PROCESS TO EXTRACT LIQUID DIELECTRIC COOLANT FROM THE RICE BRAN OIL

TECHNICAL FIELD OF THE INVENTION

The present invention relates to a process to extract liquid dielectric coolant from rice bran, which is suitable for both power frequency and high frequency electrical applications.

BACKGROUND OF THE INVENTION

Liquid dielectric coolant plays a dual role as an insulating medium between the energized parts and as well as a coolant in the performance of electrical equipments particularly in power distribution transformers, high frequency and high voltage transformers and in electrical apparatus or appliances. The mineral oil and silicone fluid are the most common liquid dielectric coolants used in power frequency transformers and high frequency transformers. The performance of the liquid dielectric coolant or liquid insulation has been evaluated for its electrical, physical, chemical and thermal properties by considering various factors such as high breakdown strength, good oxidation stability or good ageing resistance, high flash point, low viscosity, good thermal conductivity for good heat dissipation, good compatibility with solid insulating materials/other materials used in electrical transformers, low dissipation factor, etc. The liquid dielectric strength defines the ability to resist electric breaks at certain frequencies of electrical power. The liquid dielectric strength is measured as the minimum electric voltage, which is required for formation of an arc between two electrodes. Recent developments in the formation of liquid insulation have led to the development of a process to extract liquid dielectric coolant from the rice bran oil, which is suitable for both power frequency and high frequency electrical applications.

Various types of conventional liquid dielectric coolants are known in the prior art, wherein most of them use mineral oil and silicone fluid as liquid insulation in power frequency transformers and in the high frequency transformers. Typically, the conventional methods use mineral oil composition for power frequency applications. The liquid dielectric coolant of the mineral oil has relatively high value of breakdown voltage for power frequency applications. However, the use of mineral oil composition as a liquid insulation does not provide support for high frequency applications, as the breakdown voltage strength drops by one third at hundred kHz (Kilo Hertz) and also the liquid insulation of the mineral oil has low flash point and is non-biodegradable.

Conventional methods use the silicone fluid as a liquid insulation for high frequency applications. The liquid dielectric coolant of the silicone fluid operates at higher temperature for high frequency applications. However, the use of silicone fluid as a liquid insulation does not provide support for power frequency applications due to fast degradation by corona effect.

Hence, there is a need for a process to extract liquid dielectric coolant, which is suitable for both power frequency and high frequency electrical applications.

SUMMARY OF THE INVENTION

The present invention overcomes the drawbacks in the prior art and provides a process to extract liquid dielectric coolant from the rice bran oil using limited composition, which is suitable for both power frequency and high frequency electrical applications. In most preferred embodiment, the process includes the step of processing the refined, bleached and deodorised rice bran oil with an alkali to remove the fatty acids therein. After processing the rice bran oil, the processed rice bran oil is blended with a Sodium Hydroxide (NaOH) solution, wherein the blended rice bran forms a top layer and a bottom layer within a short duration of time. After the formation of top layer in the rice bran oil, the top layer is extracted and is water washed and filtered. After the filtration process of the top layer, the top layer rice bran oil is mixed with the tert butyl hydroxy quinone solution. Finally, the mixture of filtered top layer and the tert butyl hydroxy quinone solution is heated to extract the liquid dielectric coolant from the rice bran oil.

In a preferred embodiment of the invention, the extracted liquid dielectric coolant has a dielectric strength of at least 45 KV.

In a preferred embodiment of the invention, the liquid dielectric coolant has power frequency dissipation factors of 0.0016 at room temperature and 0.11 at 90 degree Celsius temperature for power frequency.

In a preferred embodiment of the invention, the liquid dielectric coolant at room temperature has high frequency dissipation factors ranging from 0.0003-0.0021 at frequency ranging from 5 kHz-500 kHz and at 90 degree Celsius temperature the dissipation factor ranges from 0.00149-0.00024 at frequency ranging from 5 kHz-500 kHz.

In another embodiment of the invention, the rice bran oil is blended with an sesame seed oil to obtain the liquid dielectric coolant, wherein the blending ratio of rice bran oil and sesame seed oil is at least one of, 50:50, 70:30, or 30:70.

The prior arts use the mineral oil and silicone fluid as liquid dielectric coolants for power frequency and high frequency electrical applications. The use of the mineral oil and silicone fluid as liquid dielectric coolants includes various draw backs such as being non-biodegradable, being non eco-friendly, having relatively low flash point, non-renewable. Minor ingredients or aromatic compounds are suspected to be carcinogenic, fast degradation due to corona, expensive, etc.

The present invention overcomes draw backs in the prior arts as the liquid dielectric coolant is extracted from the rice bran oil. The liquid dielectric coolant from the rice bran has various features such as renewable resources, edible, biocompatible, eco-friendly, highly biodegradable, abundantly available in nature, requires limited composition for its extraction, high flash point, etc.

The process is easy to implement, simple and is more suitable for applications in transformer lubricants, electrical appliances, automotive lubricants, gear cutting oil, turbine oil, hydraulic oil and metal forming oil as well as general purpose lubricant.

It is to be understood that both the foregoing general description and the following details description are exemplary and explanatory and are intended to provide further explanation of the invention as claimed.

BRIEF DESCRIPTION OF THE DRAWINGS

The foregoing and other features of embodiments will become more apparent from the following detailed description of embodiments when read in conjunction with the accompanying drawings. In the drawings, like reference numerals refer to like elements.

FIG. 2 illustrates the table representing power frequency dissipation factors of the conventional liquid dielectric coolant of a biotemp.

FIG. 3 illustrates the table representing power frequency dissipation factors of the conventional liquid dielectric coolant of an envirotemp.

FIG. 4 illustrates the table representing high frequency dissipation factors of the conventional liquid dielectric coolant of silicone fluid.

FIG. 5 illustrates the table representing a relative permittivity of the conventional liquid dielectric coolants of the mineral oil and silicone fluid.

FIG. 6 illustrates the table representing a kinematic viscosity of the conventional liquid dielectric coolants of the biotemp and envirotemp.

FIG. 7 illustrates the table representing power frequency dissipation factors of the liquid dielectric coolant of rice bran oil, according to one embodiment of the invention.

FIG. 8 illustrates the table representing high frequency dissipation factors of the liquid dielectric coolant of rice bran oil, according to one embodiment of the invention.

FIG. 9 illustrates the table representing the relative permittivity of the liquid dielectric coolant of the rice bran oil, according to one embodiment of the invention.

FIG. 10 illustrates the table representing kinematic viscosity of the liquid dielectric coolant of the rice bran oil, according to one embodiment of the invention.

DETAILED DESCRIPTION OF THE INVENTION

Figure 1:
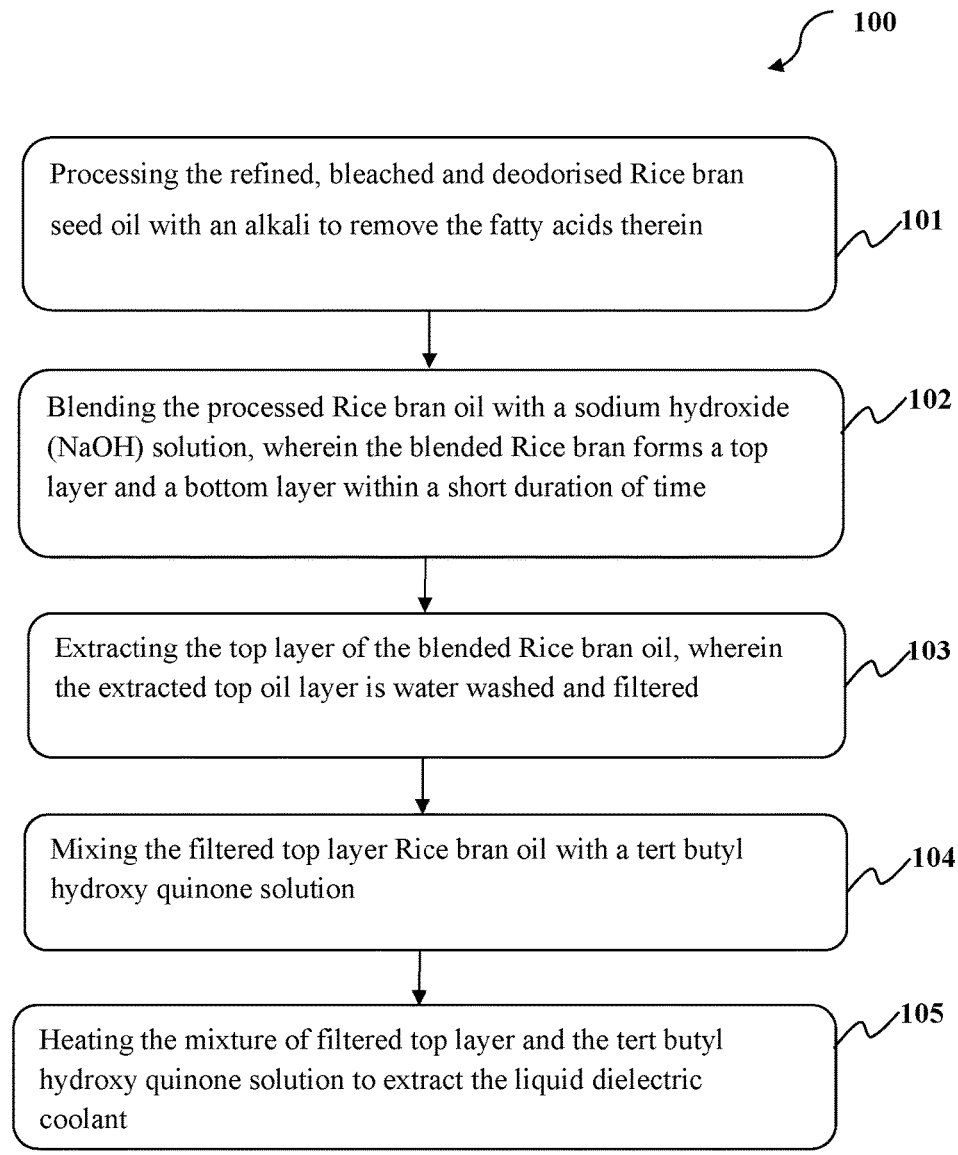
FIG. 1 illustrates a process flow for extracting the liquid dielectric coolant from the rice bran, according to one embodiment of the invention.

Reference will now be made in detail to the description of the present subject matter, one or more examples of which are shown in figures. Each embodiment is provided to explain the subject matter and not a limitation. These embodiments are described in sufficient detail to enable a person skilled in the art to practice the invention, and it is to be understood that other embodiments may be utilized and that logical, physical, and other changes may be made within the scope of the embodiments. The following detailed description is, therefore, not be taken as limiting the scope of the invention, but instead the invention is to be defined by the appended claims.

The term "biotemp and envirotemp" as claimed in the embodiments refers to the mineral oil.

The prior arts use the mineral oil and silicone fluid as liquid dielectric coolants for power frequency and high frequency electrical applications. The use of the mineral oil and silicone fluid as liquid dielectric coolants includes various draw backs such as being non-biodegradable, being non eco-friendly, having relatively low flash point, non-renewable. Minor ingredients or aromatic compounds are suspected to be carcinogenic, fast degradation due to corona, expensive, etc.

The present invention overcomes draw backs in the prior art as the liquid dielectric coolant is extracted from the rice bran oil. The liquid dielectric coolant from the rice bran oil has various features such as renewable resources, edible, biocompatible, eco-friendly, highly biodegradable, abundantly available in nature, requires limited composition for its extraction, high flash point, etc.

FIG. 1 illustrates a process flow for extracting the liquid dielectric coolant from the rice bran, according to one embodiment of the invention. In a preferred embodiment, the process 100 comprises the steps of, processing the commercially available refined, bleached and deodorized rice bran oil with an alkali to remove the fatty acids. After removing the fatty acids in the rice bran oil, at step 102, the processed rice bran oil is blended with a sodium hydroxide (NaOH) solution. The amount of NaOH solution that is blended with the rice bran oil is 10 percent of the total weight of the rice bran oil. The blended rice bran oil is allowed to settle for a short duration of time. During the short duration of time, the blended rice bran oil forms a top layer and a bottom layer. After the formation of the top layer and the bottom layer, at step 103, the top layer of the blended rice bran oil is extracted. The extracted top layer is water washed and filtered. After the filtration of the top layer, at step 104, the filtered top layer is mixed with a tert butyl hydroxy quinone solution. The amount of tert butyl hydroxy quinone solution that is mixed with the filtered top layer of rice bran oil is at least 0.75 percent of the total weight of the filtered rice bran oil. Finally, at step 105, the mixture of filtered top layer and the tert butyl hydroxy quinone solution is heated upto 150 degree Celsius for four hours to extract the liquid dielectric coolant.

FIG. 2 illustrates the table representing power frequency dissipation factors of the conventional liquid dielectric coolant of a biotemp. The table indicates the power frequency dissipation factors of the conventional liquid dielectric coolant of a biotemp at room temperature and at higher temperature. The liquid dielectric coolant has power frequency dissipation factors of 0.0015 at room temperature and 0.02 at 100 degree Celsius temperature for power frequency.

FIG. 3 illustrates the table representing power frequency dissipation factors of the conventional liquid dielectric coolant of an envirotemp. The table indicates the power frequency dissipation factors at room temperature and at higher temperature. The liquid dielectric coolant has power frequency dissipation factors of 0.0001-0.0015 at room temperature and 0.02 at 90 degree Celsius temperature for power frequency.

FIG. 4 illustrates the table representing high frequency dissipation factors of the conventional liquid dielectric coolant of silicone fluid. The table indicates the high frequency dissipation factors of the conventional liquid dielectric coolant of a biotemp at room temperature and at higher temperature. The liquid dielectric coolant has a high frequency dissipation factors of 0.00009 at 5 kHz of room temperature, 0.0004 at 100 kHz of room temperature, 0.0009 at 250 kHz of room temperature, 0.0018 at 500 kHz of room temperature, 0.00003 at 5 kHz of 90 degree Celsius temperature, 0.001 at 100 kHz of 90 degree Celsius temperature, 0.002 at 250 kHz of 90 degree Celsius temperature and 0.03 at 500 kHz of 90 degree Celsius temperature.

FIG. 5 illustrates the table representing a relative permittivity of the conventional liquid dielectric coolants of the mineral oil and silicone fluid. The liquid dielectric coolant of the mineral oil has the relative permittivity of 2.1 for power frequency applications. The relative permittivity of the silicone fluid is 2.7 for high frequency applications.

FIG. 6 illustrates the table representing a kinematic viscosity of the conventional liquid dielectric coolants of the biotemp and envirotemp. The table indicates the kinematic viscosity at 100° C. centistokes (cSt). The liquid dielectric coolant of the biotemp has the kinematic viscosity of 9.3 cSt at 100 degree Celsius. The kinematic viscosity of the envirotemp ranges from 7.7-8.3 centistokes (cSt) at 100 degree Celsius.

FIG. 7 illustrates the table representing power frequency dissipation factors of the liquid dielectric coolant of rice bran oil, according to one embodiment of the invention. In the preferred embodiment, the table indicates the power frequency dissipation factors at room temperature and at higher temperature. The liquid dielectric coolant has a power frequency dissipation factor of 0.0016 at room temperature and 0.11 at 90 degree Celsius temperature for power frequency. The power frequency dissipation factors of the rice bran oil are reasonably good when compared to the conventional envirotemp and biotemp oils.

FIG. 8 illustrates the table representing high frequency dissipation factors of the liquid dielectric coolant of Rice bran oil, according to one embodiment of the invention. In the preferred embodiment, the table indicates the high frequency dissipation factors at room temperature and at higher temperature the liquid dielectric coolant has a dissipation factor of 0.0003 at 5 kHz of room temperature, 0.0005 at 100 kHz of room temperature, 0.0011 at 250 kHz of room temperature, 0.0021 at 500 kHz of room temperature, 0.00149 at 5 kHz of 90 degree Celsius temperature, 0.00005 at 100 kHz of 90 degree Celsius temperature, 0.00011 at 250 kHz of 90 degree Celsius temperature and 0.00024 at 500 kHz of 90 degree Celsius temperature. The high frequency dissipation factors of the rice bran oil are very good when compared to the conventional silicone fluid.

FIG. 9 illustrates the table representing the relative permittivity of the liquid dielectric coolant of the rice bran oil, according to one embodiment of the invention. In the preferred embodiment, the liquid dielectric coolant has a relative permittivity of 2.7 to 3.1 for both power frequency and for high frequency. The relative permittivity of the rice bran oil is much better when compared to the conventional silicone fluid and mineral oil.

FIG. 10 illustrates the table representing a kinematic viscosity of the liquid dielectric coolant of the rice bran oil, according to one embodiment of the invention. In the preferred embodiment, the liquid dielectric coolant has a viscosity of 9.3 centistokes (cSt) at 100 degree Celsius. The kinematic viscosity of the rice bran oil is much better when compared to the conventional biotemp and envirotemp.

In the preferred embodiment, the extracted liquid dielectric coolant has a dielectric strength of 45 KV.

In further embodiment, the rice bran oil is blended with a sesame seed oil to obtain the liquid dielectric coolant using preceding steps. The blending ratios are 50 percent of sesame seed oil and 50 percent of rice bran oil, 70 percent of sesame seed oil and 30 percent of rice bran oil and 30 percent of sesame seed oil and 70 percent of rice bran oil.

The prior arts use the mineral oil and silicone fluid as liquid dielectric coolants for power frequency and high frequency electrical applications. The use of the mineral oil and silicone fluid as liquid dielectric coolants includes various draw backs such as being non-biodegradable, being non eco-friendly, having relatively low flash point, non-renewable. Minor ingredients or aromatic compounds are suspected to be carcinogenic, fast degradation due to corona, expensive, etc.

The present invention overcomes draw backs in the prior arts as the liquid dielectric coolant is extracted from the rice bran oil. The liquid dielectric coolant from the rice bran oil has various features such as renewable resources, edible, biocompatible, eco-friendly, highly biodegradable, abundantly available in nature, requires limited composition for its extraction, high flash point, etc.

The process is easy to implement and simple and is more suitable for applications in transformer lubricants, electrical appliances, automotive lubricants, gear cutting oil, turbine oil, hydraulic oil and metal forming oil as well as general purpose lubricant applications.

It is to be understood, however, that even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

We claim:
1. A process to extract liquid dielectric coolant from the rice bran oil, the process comprises the steps of:
    a. blending the refined, bleached and deodorised rice bran oil with an alkali sodium hydroxide (NaOH) solution to remove the fatty acids therein, wherein the blended rice bran oil forms a top layer and a bottom layer;
    b. extracting the top layer of the blended rice bran oil, wherein the extracted top oil layer is water washed and filtered;
    c. mixing the filtered rice bran oil with a tert butyl hydroxyl quinone; and
    d. heating the mixture to eliminate moisture to realise the liquid dielectric coolant.

2. The process as claimed in claim 1, wherein the amount of NaOH solution that is blended with the rice bran oil is at least 10 percent of the total weight of the rice bran oil.

3. The process as claimed in claim 1, wherein the amount of tert butyl hydroxy quinone that is mixed with the filtered top layer of rice bran oil is at least 2.5 percent of the total weight of the filtered rice bran oil.

4. The process as claimed in claim 1, wherein the extracted liquid dielectric coolant has a dielectric strength of at least 45 KV.

5. The process as claimed in claim 1, wherein the liquid dielectric coolant has a power frequency dissipation factors of 0.0016 at room temperature and 0.11 at 90 degree Celsius temperature for power frequency.

6. The process as claimed in claim 1, wherein the liquid dielectric coolant at room temperature has high frequency dissipation factors ranging from 0.0003-0.0021 at frequency ranging from 5 kHz-500 kHz and at 90 degree Celsius temperature the dissipation factor ranges from 0.00149-0.00024 at frequency ranging from 5 kHz-500 kHz.

7. The process as claimed in claim 1, wherein the liquid dielectric coolant has a relative permittivity of 2.7 to 3.1 for both power frequency and for high frequency application.

8. The process as claimed in claim 1, wherein the liquid dielectric coolant has a kinematic viscosity of 9.3 centistokes (cSt) at 100 degree Celsius.

9. The process as claimed in claim 1, wherein the rice bran oil is blended with a sesame seed oil to obtain the liquid dielectric coolant, wherein the blending ratio of rice bran oil and sesame seed oil is at least one of:
    a) 50:50,
    b) 70:30, or
    c) 30:70.

* * * * *